United States Patent
Benveniste

[11] Patent Number: 5,531,420
[45] Date of Patent: Jul. 2, 1996

[54] ION BEAM ELECTRON NEUTRALIZER

[75] Inventor: Victor M. Benveniste, Gloucester, Mass.

[73] Assignee: Eaton Corporation, Cleveland, Ohio

[21] Appl. No.: 270,022

[22] Filed: Jul. 1, 1994

[51] Int. Cl.$^6$ .................................................. H05H 3/00
[52] U.S. Cl. ......................................................... 250/251
[58] Field of Search ............................... 250/251, 492.21

[56] References Cited

U.S. PATENT DOCUMENTS

| | | | |
|---|---|---|---|
| 4,140,576 | 2/1979 | Fink et al. | 250/251 |
| 4,361,762 | 11/1982 | Douglas | 250/251 |
| 4,804,837 | 2/1989 | Farley | 250/251 |
| 4,825,087 | 4/1989 | Renau et al. | 250/492.2 |
| 4,886,971 | 12/1989 | Matsumura et al. | 250/492.2 |
| 4,904,902 | 2/1990 | Tamai et al. | 250/492.2 |
| 4,914,292 | 4/1990 | Tamai et al. | 250/492.2 |
| 4,916,311 | 4/1990 | Fuzishita et al. | 250/492.2 |
| 4,960,990 | 10/1990 | Lavan et al. | 250/251 |
| 4,994,674 | 2/1991 | Tamai et al. | 250/492.2 |
| 5,089,710 | 2/1992 | Kikuchi et al. | 250/492.3 |
| 5,126,576 | 6/1992 | Wauk, II et al. | 250/492.3 |
| 5,136,171 | 8/1992 | Leung et al. | 250/492.2 |
| 5,160,695 | 11/1992 | Bussard | 376/107 |
| 5,164,599 | 11/1992 | Benveniste | 250/492.2 |
| 5,326,980 | 7/1994 | Tajima et al. | 250/397 |

Primary Examiner—Bruce C. Anderson
Attorney, Agent, or Firm—Watts, Hoffmann, Fisher & Heinke Co.

[57] ABSTRACT

An ion beam neutralizer has an electron source and an electron deflector for directing electrons from the source into an ion beam. A power supply biases an acceleration grid to a potential suitable for accelerating electrons away from a filament that produces electrons. A second grid defines an electric field through which the electrons move. Electrons pass through the second grid and are deflected by a field between the second grid and a parabolic shaped metal deflector.

12 Claims, 9 Drawing Sheets

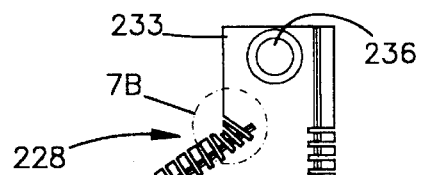
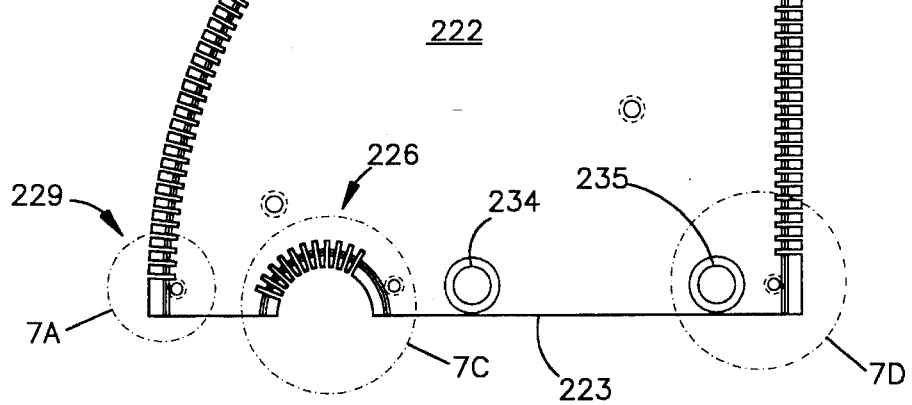
Fig.7
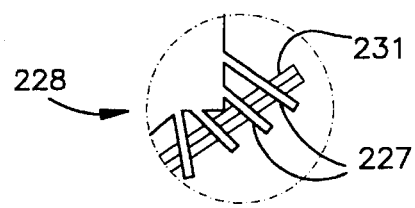
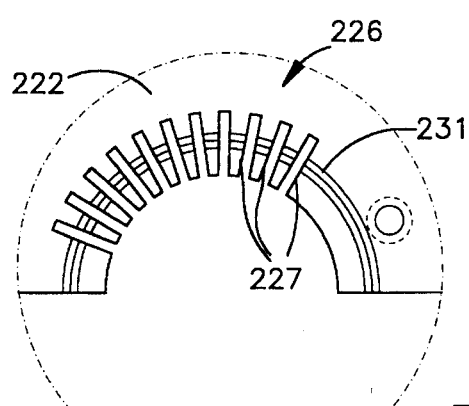
Fig.7C
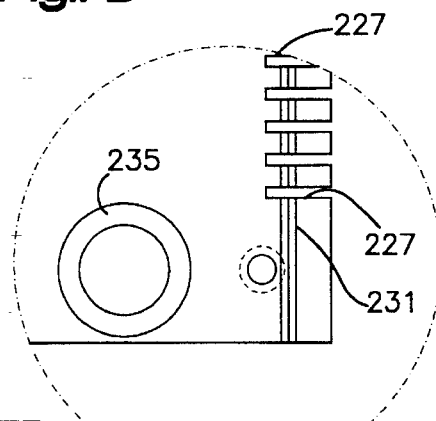
Fig.7D

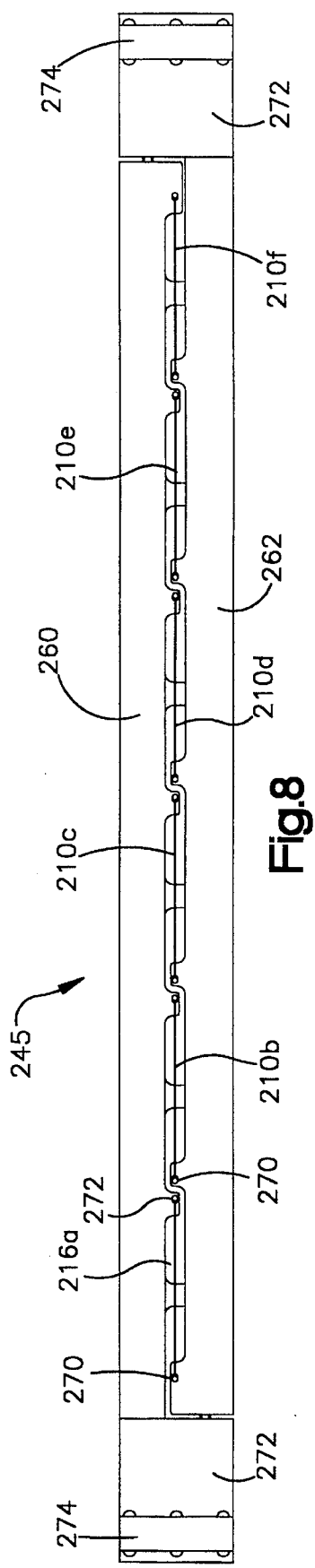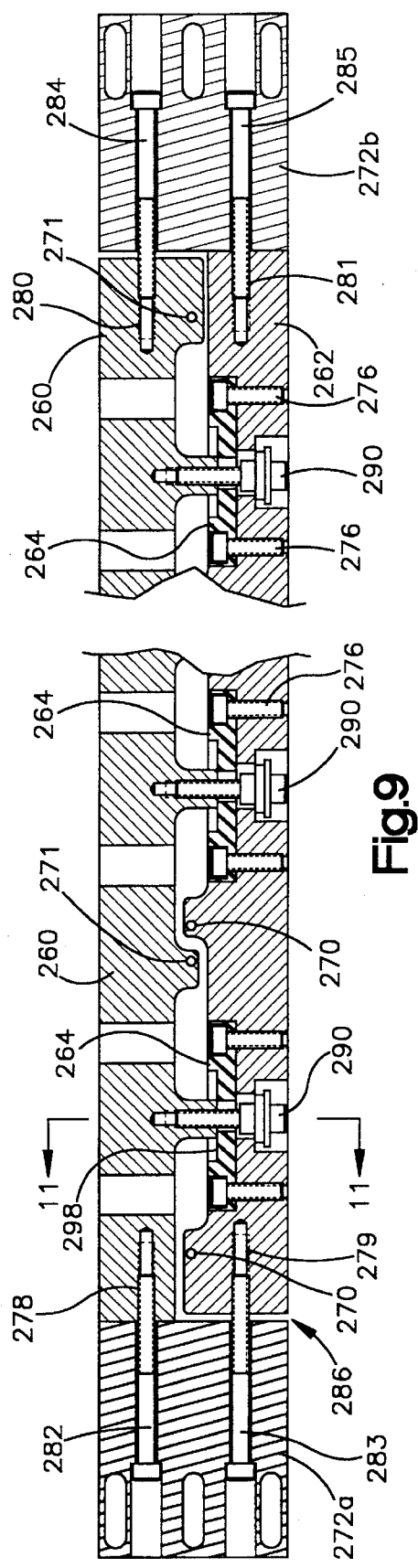

ION BEAM ELECTRON NEUTRALIZER

FIELD OF THE INVENTION

The present invention concerns an ion implanter that generates an ion beam used in treating a semi-conductor wafer and more specifically concerns an ion beam neutralizer for neutralizing an ion beam before the beam strikes the wafer.

BACKGROUND ART

One use for ion implanters is in doping silicon wafers to form semi-conductor wafers suitable for further treatment during the process of fabricating integrated circuits. If the impurities used in doping the wafers can be ionized and shaped into the form of an ion beam, the ion beam can be used to dope the silicon wafers by causing the ion beam to strike the wafers in controlled concentrations.

One problem experienced in ion implantation doping of wafers is a problem of wafer charging. As the ion beam impacts the wafer, the wafer surface becomes positively-charged. The charging is often nonuniform and can create large electric fields at the wafer surface. These fields can damage the wafer, making it unsuitable for use as a semi-conductor material.

In some prior art implantation systems, an electron shower device is used to neutralize the space charge of the ion beam. Existing electron shower devices utilize secondary electron emissions caused when an energetic electron strikes a metal surface. Low-energy electrons from the metal surface are either trapped in the ion beam or are directed to impact the wafer surface thereby directly neutralizing the wafer.

The current density of electrons obtained by secondary emissions from a metal surface is limited by the potential difference between the ion beam and the metal electron-emitting surface. The ion beam potential drops as neutralization takes place. The secondary emission electron current that can be extracted from the emitting surface will then decrease. In the case of a charged ion beam directed onto an electrically isolated wafer, the electron current must be equal to the ion beam current for the neutralizer to prevent wafer charging. If the beam potential is initially low, the wafer charges until the ion beam potential is large enough to extract a required amount of electron current from the electron-emitting surface.

A low potential ion beam can produce wafer charging. The center of the beam may remain positive and the exterior negative due to concentrations of negative charge surrounding the ion beam. In practice, it has been found that the space charge at the metallic electron emitting surface is partially neutralized by slow ions from residual gas ionization along the ion beam path. As a result, higher electron currents then would be expected from theory can be extracted and, in fact, prior art techniques take advantage of residual gas pressures to provide low-energy electrons.

U.S. Pat. No. 4,804,837 to Farley discloses a beam neutralizing system having a source of high-energy electrons. These electrons are deflected back and forth through a neutralizing region containing an ionizable gas. As the high-energy electrons pass through the region, they ionize the gas providing low-energy electrons for beam neutralization. The disclosure of the '837 patent to Farley is incorporated herein by reference. A stated goal of the '837 patent to Farley is to increase the time period electrons in the region of the ion beam encounter gas molecules thereby increasing the production of secondary electrons.

If an ion beam cannot be "sufficiently" neutralized, it tends to blow-up or expand due to the mutual repulsion of the positively-charged ions within the beam. To minimize the region of this blow-up, an electron barrier can be placed upstream from the electron shower. A typical ion implantation chamber has a support that rotates silicon wafers through the ion beam along a circular path so that the ion beam encounters a wafer, then a wafer support held at ground potential, and then a next subsequent wafer, etc. This causes the ion beam potential to rapidly fluctuate as the wafers pass through the ion beam. Variations in this beam potential are reduced by placement of a constant potential aperture plate upstream from a region of ion beam neutralization.

Fluctuation in beam potential is reduced by placement of a negatively biased aperture that produces a potential minimum along the ion beam. Electrons from the beam neutralizer cannot penetrate this aperture.

The use of suppression apertures has two undesirable consequences. The aperture introduces a boundary condition causing a sharp divergence in beam potential. This can exacerbate the beam blow-up downstream from the suppression aperture. Additionally, the electric field in the region of the aperture can deflect electrons from a beam neutralizer downstream to the region of the implantation chamber. This has the undesirable result of producing a region of positive charge at a central core of the ion beam and a negative charge at the outer periphery of the ion beam. Stated another way, the ion beam is neutral in a broad sense: but at the wafer surface, a positive charge build-up occurs at the wafer center and a negative charge occurs around the outer circumference. This results in the creation of large, undesirable electric fields.

U.S. Pat. No. 5,164,599 to Benveniste discloses an alternate beam neutralizer. A cylindrical electron source encircles an ion beam. Electrons emitted by an array of filaments spaced about the beam pass through the beam and collide with an inwardly facing wall of the neutralizer. Secondary electron emissions occur that neutralize the beam. The disclosure of the '599 patent to Benveniste is also incorporated by reference. The present invention presents an alternative to the systems disclosed in the Farley and Benveniste patents.

DISCLOSURE OF THE INVENTION

An ion implanter constructed in accordance with the present invention treats workpieces with ions from an ion source. Positively-charged ions emitted from the source are shaped to form an ion beam that treats workpieces at an implantation station. A beam neutralizer upstream from the implantation station has an electrically conductive field defining reflector having an inwardly facing curved surface for directing electrons into the ion beam. An electron source emits neutralizing electrons into a region near the reflector that are first accelerated toward the reflector and are then deflected away from the deflector toward the ion beam. A power supply biases the reflector with respect to the electron source to deflect the ions from the trajectories they follow just after they are emitted by the electron source to paths that cause them to move toward the ion beam along generally parallel paths.

The beam neutralizer makes a large supply of low-energy electrons available for capture by the ion beam. The supply of electrons is free of high-energy components and is essentially non-energetic at a low energy.

In accordance with a preferred embodiment of the present invention, the electron source is constructed from a series of end-to-end electron-emitting filaments. Electrons from such filaments are emitted in all directions and accelerated away from the filaments by a grid. The electrons move outward to enlarge the region of electron neutralization. The electrons are then reflected by an elongated reflector that is parabolic in cross section and which extends the length of the neutralizer.

The objects, advantages and features of the invention will become better understood by review of the accompanying detailed description of a preferred embodiment of the invention which is described in conjunction with the accompanying drawings.

BRIEF DESCRIPTION OF THE DRAWINGS

FIG. 7 is an enlarged elevation view of one of four supports for electrically energizing grids to accelerate electrons from electron-emitting filaments supported within the beam neutralizer;

FIGS. 7A–7D are enlarged views of regions of the FIG. 7 support showing details of the construction of the support;

FIG. 8 is a plan view of a filament support for multiple elongated electron-emitting filaments;

FIG. 9 is a section view of the FIG. 8 filament support;

BEST MODE FOR PRACTICING THE INVENTION

Figure 1:
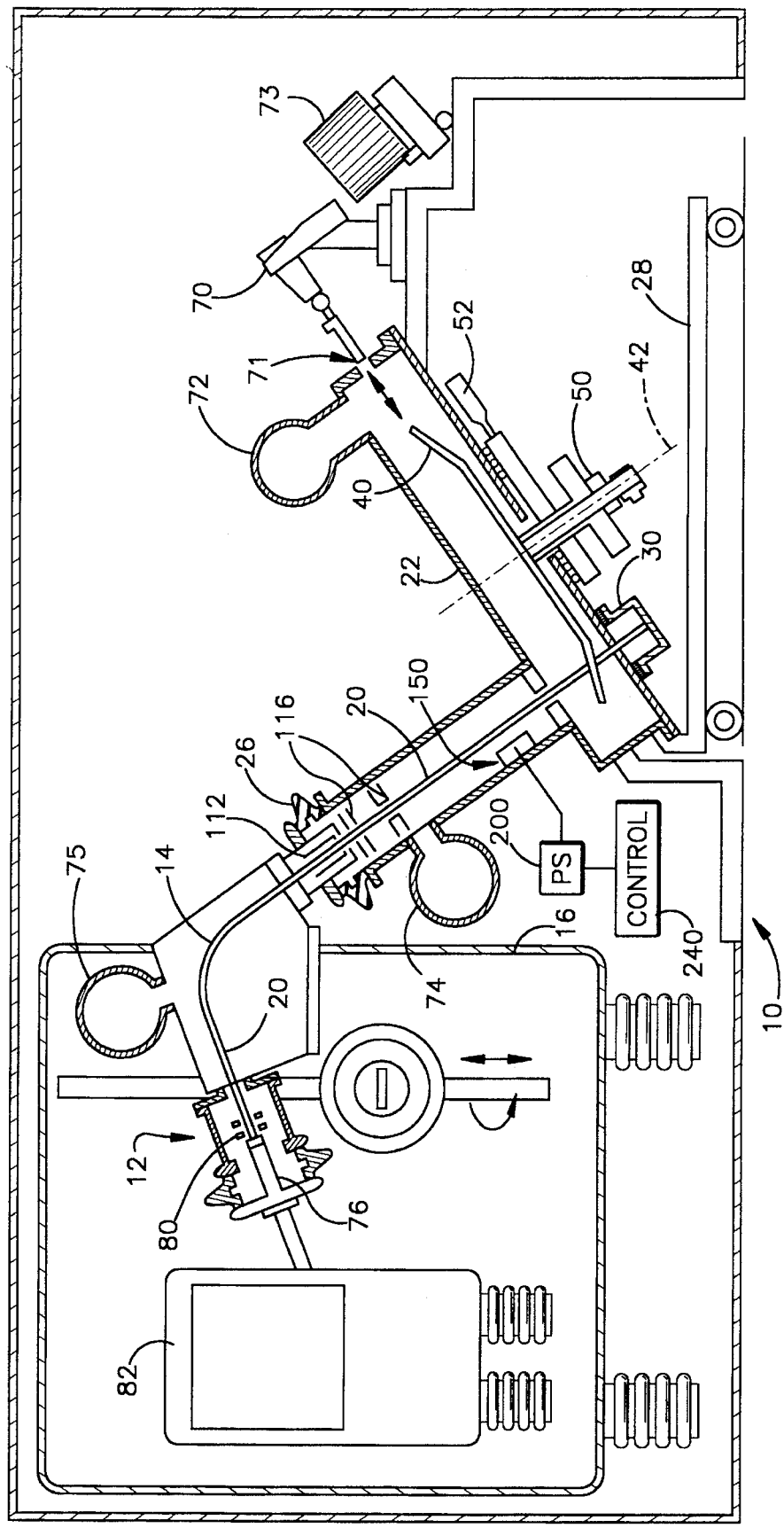
FIG. 1 is a schematic depiction of an ion implantation system.

FIG. 1 depicts an ion implantation system 10 having an ion source 12 and a beam analyzing magnet 14 supported by a high-voltage housing 16. An ion beam 20 emanating from the source 12 follows a controlled travel path that exits the housing 16 and enters an ion implantation chamber 22. Along the beam travel path from the source 12 to the implantation chamber 22, the ion beam 20 is shaped, evaluated and accelerated to a desired implantation energy.

The analyzing magnet 14 causes only those ions having an appropriate mass to reach the ion implantation chamber 22. In the region the beam 20 exits the housing 16, the ion beam 20 passes through a high-voltage isolation bushing 26 constructed from an electric insulating material that isolates the high-voltage housing 16 from the implantation chamber 22.

The ion implantation chamber 22 is supported on a movable pedestal 28 that allows the chamber 22 to be aligned relative to the ion beam 20. The ion beam 20 impinges upon a wafer support 40 mounted for rotation about an axis 42. The wafer support 40 supports multiple silicon wafers around its outer periphery and moves those wafers along a circular path. The ion beam 20 intercepts the wafer travel path causing ions to impact each of the wafers and selectively dope those wafers with ion impurities. High-speed rotation of the support 40 is effected by a motor 50 which rotates the support 40 and wafers. A linear drive 52 causes the support 40 to be indexed back and forth within the chamber 22 to allow untreated wafers to be moved into the beam path and treated wafers to be withdrawn from the chamber 22.

Additional details concerning prior art ion implantation systems are contained in U.S. Pat. No. 4,672,210 to Armstrong et al. The subject matter of this prior art patent is incorporated herein by reference.

Silicon wafers are inserted into the ion implantation chamber 22 by a robotic arm 70 through a vacuum port 71. The chamber 22 is evacuated by a vacuum pump 72 to a low pressure equal to the pressure along the ion beam path. The robotic arm 70 transfers wafers back and forth between a cassette 73 for storing the wafers. Mechanisms for accomplishing this transfer are well known in the prior art. Additional pumps 74, 75 evacuate the ion beam path from the source 12 to the implantation chamber 22.

The source 12 includes a high-density plasma chamber 76 having an elongated, generally elliptically shaped exit aperture. Additional details concerning the source 12 are disclosed in U.S. Pat. No. 5,026,997 to Benveniste et al which is incorporated herein by reference. As ions migrate from the plasma chamber 76, they are accelerated away from the chamber 76 by electric fields set up by extraction electrodes 80 positioned just outside the exit aperture. The analyzing magnet 14 produces a magnetic field that bends ions having the correct mass to an implant trajectory. These ions exit the analyzing magnet 14 and are accelerated along a travel path leading to the implantation chamber 22. An implanter controller 82 is located within the high-voltage housing 16 and adjusts the magnet field strength by controlling current in the magnet's field windings.

The source 12 produces a large fraction of ions having a mass different from the ions used for implantation. These unwanted ions are also bent by the analyzing magnet 14 but are separated from the implantation trajectory. Heavy ions follow a large radius trajectory, for example, and ions that are lighter than those used for implantation follow a tighter radius trajectory.

A Faraday cup (not shown) is positioned along the beam travel path at a location downstream from the magnet 14. The Faraday cup can be moved into the ion beam 20 to intercept ions and prevent them from reaching the implantation chamber 22. The Faraday cup is used during beam set-up to monitor ion beam current. The Faraday cup is also used to intercept ions during other time intervals when ion implantation is suspended, such as when wafers are loaded and unloaded in and out of the chamber 22.

After leaving the magnet 14, the ion beam 20 is focused by a quadrapole lens 112 which is located in the region of the high-voltage isolation bushing 26. The quadrapole lens 112 deflects ions within the ion beam 20 in mutually orthogonal directions to focus the ion beam to an image plane in a manner similar to the focusing effect a convex lens has on light beams. Ions within the beam 20 that are not sufficiently deflected and focused by the quadrapole lens 112 exit from the ion beam and never reach the ion implantation chamber 22. Ions that reach the region of the image plane are accelerated by acceleration electrodes 116 to a desired final implantation energy.

Figure 2:
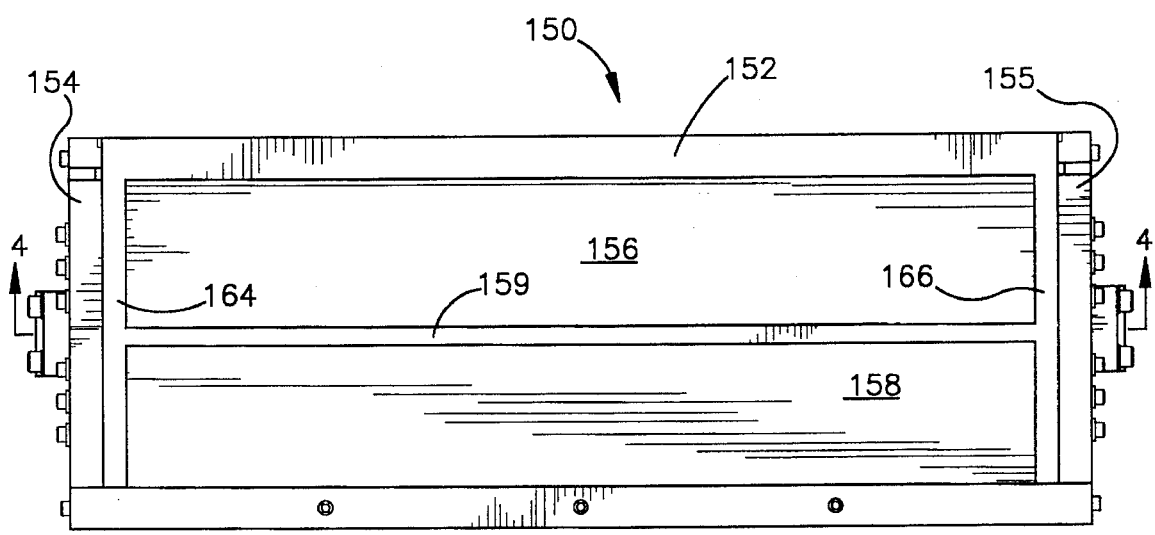
FIG. 2 is a plan view showing an ion beam neutralizer as seen from the plane of an ion beam.
Figure 3:
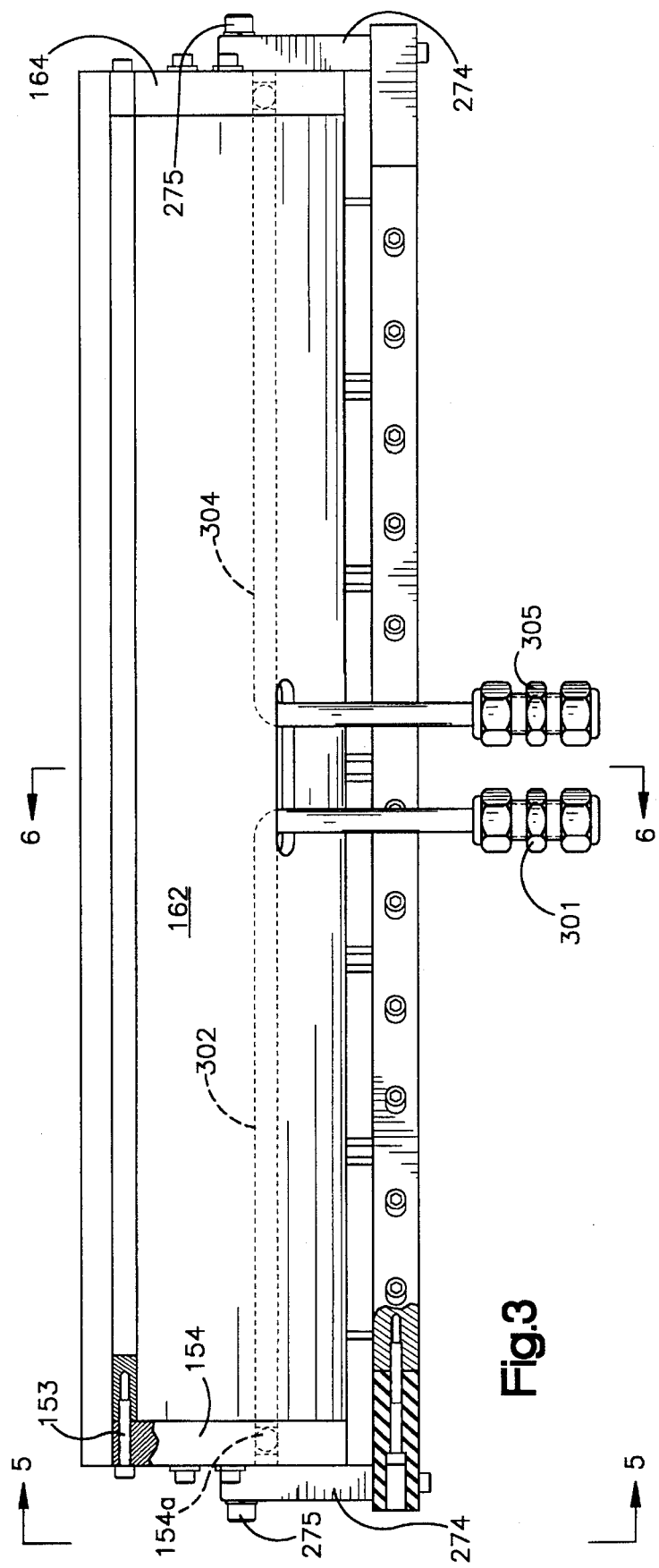
FIG. 3 is a partially-sectioned elevation view of the FIG. 2 ion beam neutralizer for injecting low-energy electrons into an ion beam.

During ion implantation, the Faraday cup is withdrawn from the ion beam path and the ion beam passes a beam neutralizer 150 (FIGS. 2 and 3) just before entering the chamber 22. The beam neutralizer 150 injects low-energy electrons into the ion beam at a rate equal to the ion beam current to minimize wafer charging within the implantation chamber 22. In the vicinity of the ion neutralizer 150, the beam 20 has been shaped to a thickness of 2 inches and a width of 10 inches.

Beam Neutralization

The beam neutralizer 150 includes a generally planar frame 152 that faces the beam 20 and which is coupled by connectors 153 to two end walls 154, 155 at opposed ends of the neutralizer 150. The frame 152 defines two generally rectangular openings 156, 158 about 12 inches long and 2 inch wide and separated by a crosspiece 159. Low-energy electrons leave the neutralizer 150 through the openings 156, 158 to enter the beam 20. These electrons are provided in sufficient quantities to neutralize the beam before the beam enters the ion implantation chamber 22.

Figure 2A:
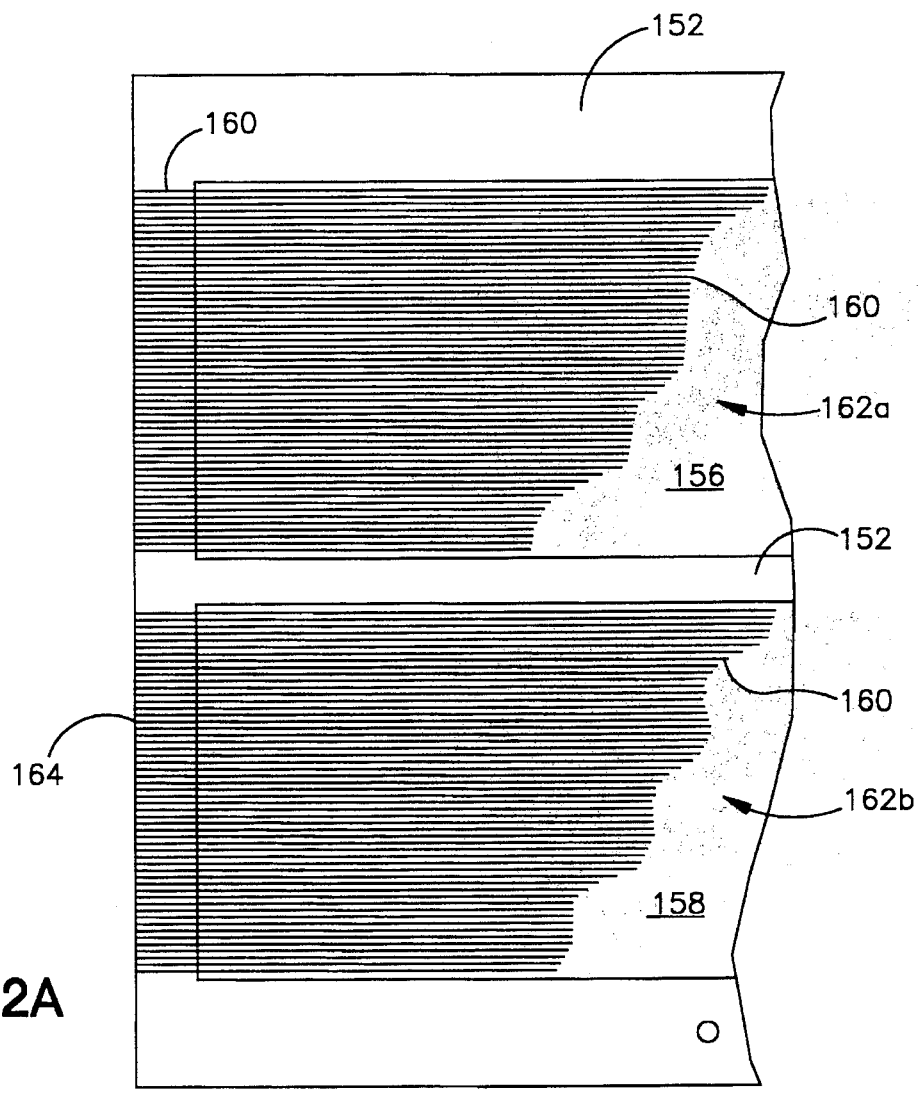
FIG. 2A is an enlarged plan view of the ion beam neutralizer showing a grid that allows electrons to exit the neutralizer and enter the ion beam.
Figure 4:
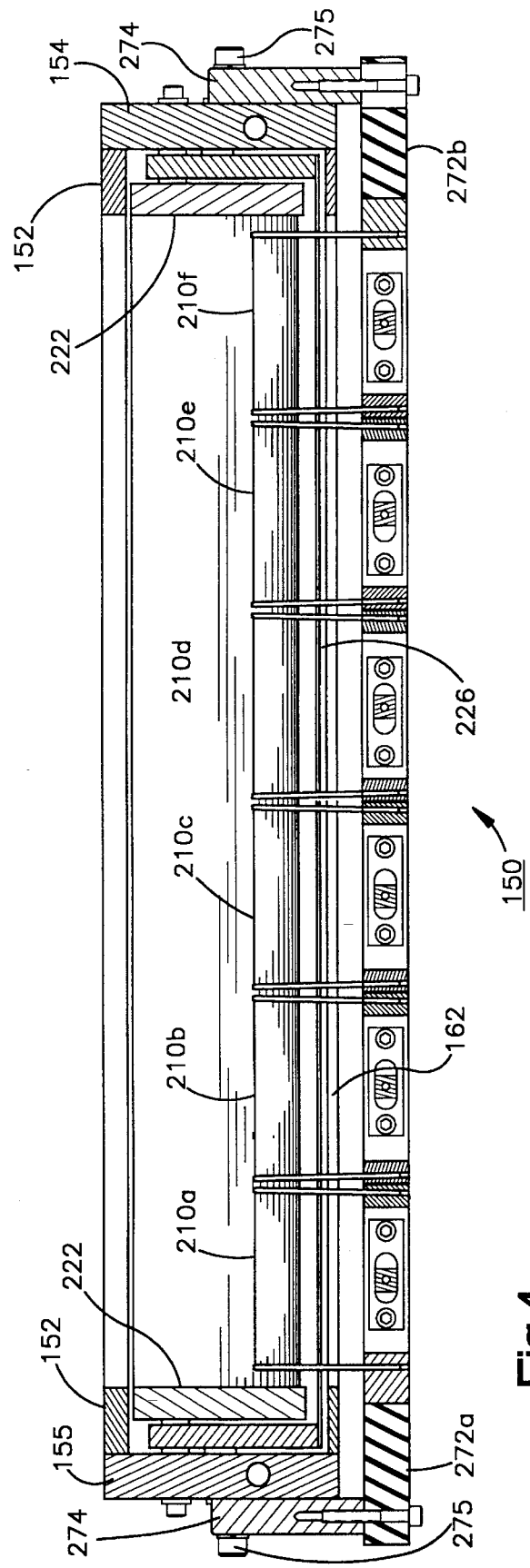
FIG. 4 is a section view of the beam neutralizer as seen from the plane 4—4 of FIG. 2.

Stretched across the openings 156, 158 in the frame 152 are lengths of tungsten wire 160 (FIG. 2A) which form grids 162a, 162b through which the electrons pass on their way to the ion beam. Each of the grids 162a, 162b is made up of a single elongated wire strung back and forth from one end of the frame 152 to the other multiple times. Frame endpieces 164, 166 have notches regularly spaced across the width of the frame into which the wires 160 are placed. The frame 152 and grids 162a, 162b are maintained at a ground potential by a power supply 200. This power supply 200 electrically biases six filaments 210a–f (FIG. 4) located inside the neutralizer 150 which provide low-energy electrons for neutralizing the beam 20. After the electrons are thermionically emitted from the filaments 210a–f, they accelerate away from the filaments 210a–f and are deflected along paths which cause the electrons to exit the neutralizer 150 through the grids 162a, 162b.

Electron Travel Path

Figure 6:
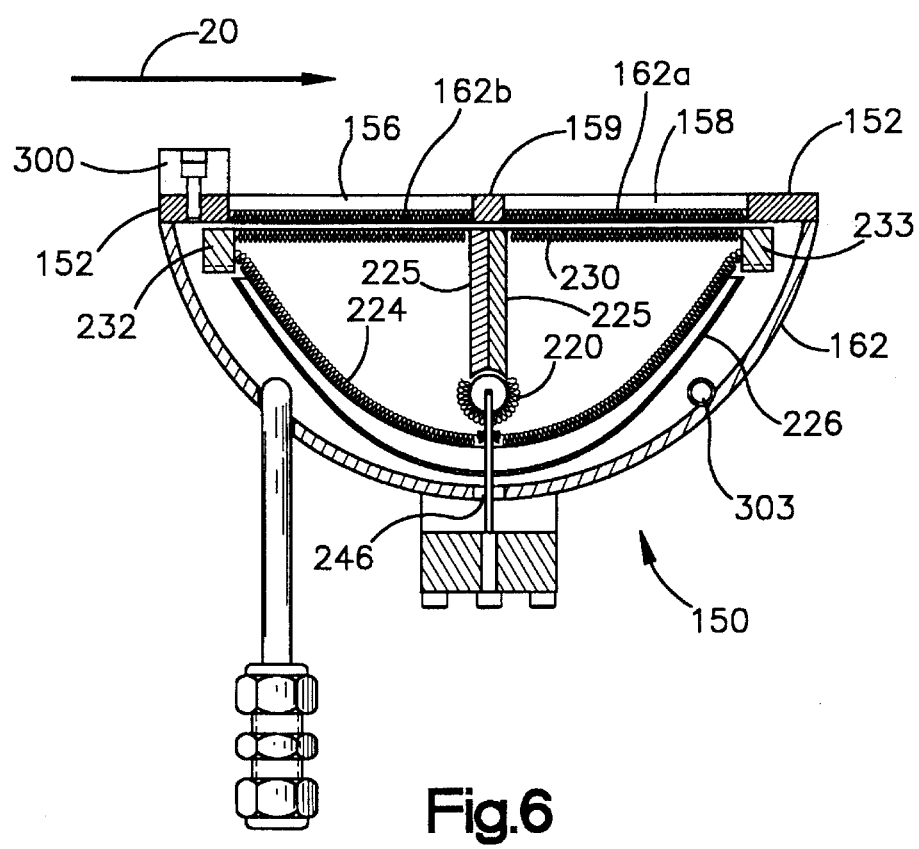
FIG. 6 is a section view of the beam neutralizer seen from the plane 6—6 of FIG. 3.
Figure 10:
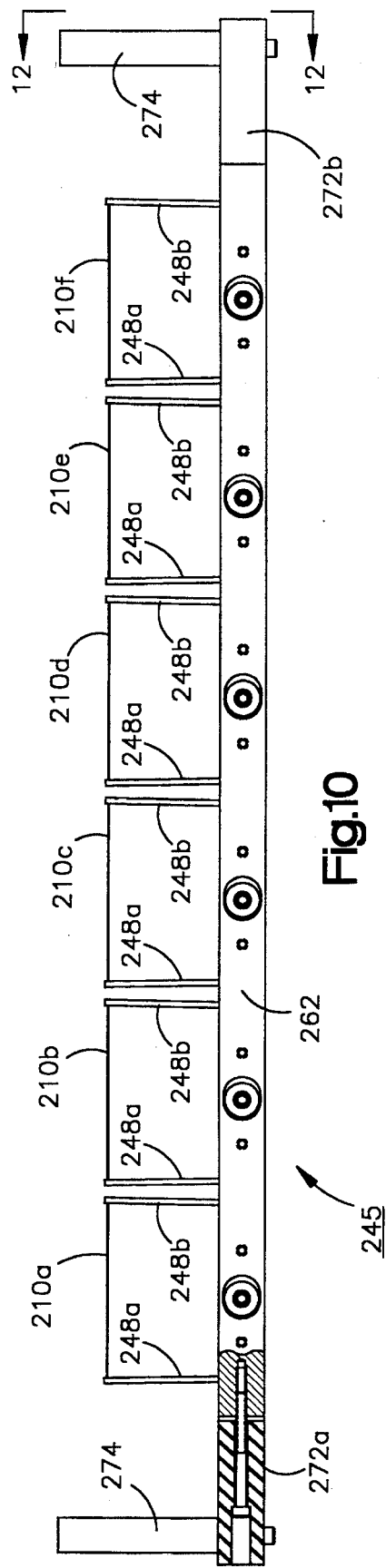
FIG. 10 is a partially sectioned side elevation view of the filament support.
Figure 12:
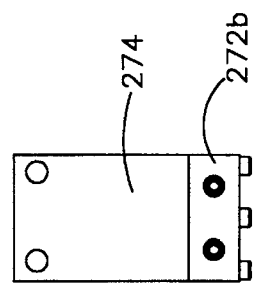
FIG. 12 is an end elevation view of the filament support.
Figure 11:
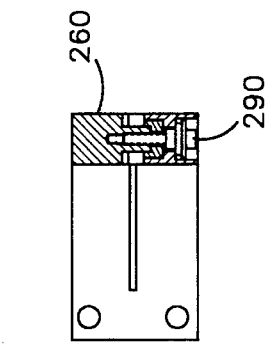
FIG. 11 is a view as seen from the plane 11—11 in FIG. 9.

As seen most clearly in FIG. 6, the neutralizer 150 includes an interior bounded by an outer wall 162 in the form of a half cylinder enclosed at either end by the end walls 154, 155. The six elongated filaments 210a–f are stretched along a line extending a substantial part of the length of the wall 162 and emit electrons into a center region of the neutralizer 150.

When the electrons leave the filaments, they are accelerated away from the line of filaments 210a–f by a first small-diameter grid 220 held at a potential of 100 volts by the power supply 200. This potential sets up an electric field in a region bounding the filaments 210 that causes the electrons to accelerate to an energy of approximately 100 electronvolts and move radially outward away from the filaments 210 and pass through the grid 220.

The grid 220 is most preferably constructed from multiple strands of elongated wire strung back and forth the length of the neutralizer 150 and energized to the 100-volt accelerating potential. FIG. 7 illustrates one of four molybdenum supports 222 for the grid 220. Each end of the neutralizer 150 is bounded by two such supports 222 which meet along a centerline 223 of the neutralizer 150.

After the electrons have been accelerated to an energy of 100 electronvolts, and pass through the grid 220, they enter a region bounded by the first grid 220 and a second grid 224 which is also biased at a 100-volt potential. Two metal crossplates 225 that space the supports 222 intercept electrons leaving the filaments 210 along paths that would cause the electrons to directly enter the ion beam 20. In the region between the two grids 220, 224, the 100-electronvolt energy electrons travel in straight paths along uninterrupted trajectories. This causes the electrons to expand outwardly and form a widened electron neutralization envelope. When the electrons reach the second grid 224, they pass through since the grid is made up of multiple wire lengths that extend between the endpieces 222.

The grid 220 is supported by a region 226 of the support 222 having multiple notches 227 (FIG. 7C) which position the multiple strands of wire that make up the grid 220. A 'v'-shaped groove 23 1 in the support 222 passes through the notches 227 and positions the wire as it is wound back and forth between oppositely positioned supports 222. The grid 224 extends along a curved portion of the support 222 between two end regions 228, 229 having similar notches 227 and 'v' grooves 231. Each of the supports 222 is biased to a voltage of 100 volts by the power supply 200.

The four supports 222 form part of a grid assembly that is assembled in two halves. Before the grids are strung back and forth between the supports 222, two supports are connected together by a crossplate 225 and a crosspiece 232 that connects to a tab portion 233 of the support 222. The crossplate has tapped holes (not shown) at either end so that socket head screws can be inserted into counter bored holes 234, 235 in the support 222 and screwed into the crossplate 225. The crosspiece 232 has a single tapped hole at either end. A socket head screw is screwed into the tapped hole after it is inserted through a counter bored hole 236 in the support 222. After the tungsten wire is strung back and forth to make up the grids, the two halves to the grid assembly are brought together to form a completed assembly.

Figure 13:
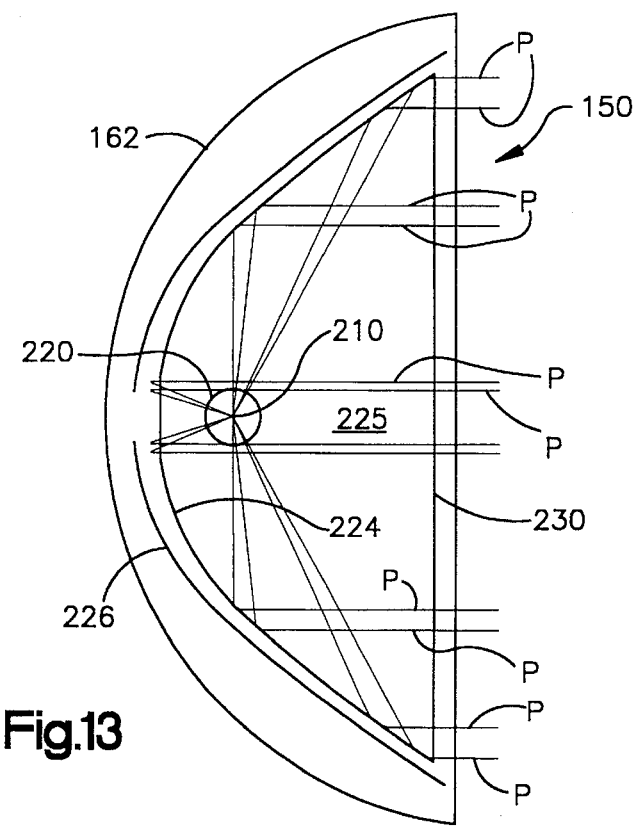
FIG. 13 is a schematic of the beam neutralizer showing electrons being emitted from filaments, accelerated from the filaments, and reflected into the ion beam.

After passing through the second grid 224, electrons from the filaments 210 enter a region bounded by the second grid 224 and a reflector 226 that is biased by the power supply 200 at a potential of approximately −5 volts DC that is electrically isolated from the supports 222 for the grids 220, 224. After passing through a region of essentially unaccelerated motion between the grids 220, 224, the electrons experience a strong electric field causing them to reflect away from the reflector 226 along paths P (FIG. 13) that are parallel to each other. The electrons again pass through the second grid 224. After they pass through the 100-volt grid 224 the second time, the electrons move toward the ion beam 20 and through a third grid 230 attached to the support 222 that is also maintained at 100 volts D.C.

The electrons passing through the grid 230 leave the neutralizer through one of the grounded grids 162a, 162b and enter the ion beam 20. In the space between the grid 230 and the grids 162a, 162b, the electrons de-celerate from 100 electronvolts to a low energy corresponding to the bias on the filaments 210a–f. By controlling the current through the filaments 210a–f, a controller 240 adjusts the current density of a wide envelope of low-energy electrons to neutralize the beam.

Filament Mount

A filament mounting assembly 245 supports the six filaments 210a–f in a line along the beam neutralizer 150. Each of the six filaments 210a–f is mounted to a pair of elongated metal tines 248a, 248b that extend through a slot 246 in the wall 162 into the center region of the neutralizer 150. The tines align and tension the six filaments 210.

The tines are supported by first and second biasing plates 260, 262 that electrically energize the tines and, therefore, the electron-emitting filaments. The two biasing plates 260, 262 are physically separated by six electrical insulators 264 (FIG. 9) along the length of the plates 260, 262. During fabrication of the assembly 245, the tines 248a are inserted into holes 270 equally spaced along the length of the biasing plate 262 and the tines 248b are inserted into equally spaced holes 271 in the plate 260. The plates 260, 262 are then connected to electrically insulating supports 272a, 272b. Small holes at the ends of the tines allow tungsten wire to be pass through two adjacent tines, stretched taut between them and then wound around the tine. The assembly 245 is then attached to the beam neutralizer by inserting the tines and filaments through the wall 162 and connecting two metal plates 274 that are attached to the insulating supports 272 to the two end walls 154, 155 of the beam neutralizer 150 by connectors 275 extending through the plates 274 and into the end walls 154, 155.

The section view of the first and second biasing plates in FIG. 9 shows the insulators 264 attached to the biasing plate 260 by means of connectors 276. Threaded bores 278–281 at opposed ends of the biasing plate 260 align with corresponding openings in the supports 272a, 272b. Connectors 282–285 extend through the openings in the supports 272a, 272b into the spaced apart bores 278–281. As seen in FIG. 9, the connector 283 bridges a small gap 286 between the biasing plate 262 and the support 272a.

First, the biasing plate 260 is attached to the insulating supports 272a, 272b, and then the second biasing plate 262 is attached to the assembly 245. The connectors 283, 285 are passed through the supports 272a, 272b and into the biasing plate 262. Six connectors 290 pass through openings 291 in the insulators 264 and thread into openings in the biasing plate 260. Insulating spacers 292 space the first biasing plate 260 from the metal connector 296. The connector 290 is tightened until the spacer 292 abuts a well 294 in the biasing plate 260 and fingers 296 extending from the plate 260 contact a depression 298 in the insulators 264. The second biasing plate 262 is thus maintained in close proximity to the first, but an insulating air gap is maintained along its length. Loosening and tightening the connectors 283, 284 adjusts the relative axial position between the two biasing plates 260, 262. This tightens or loosens the filaments stretched between the tines prior to insertion of the filament assembly into the ion beam neutralizer.

Figure 5:
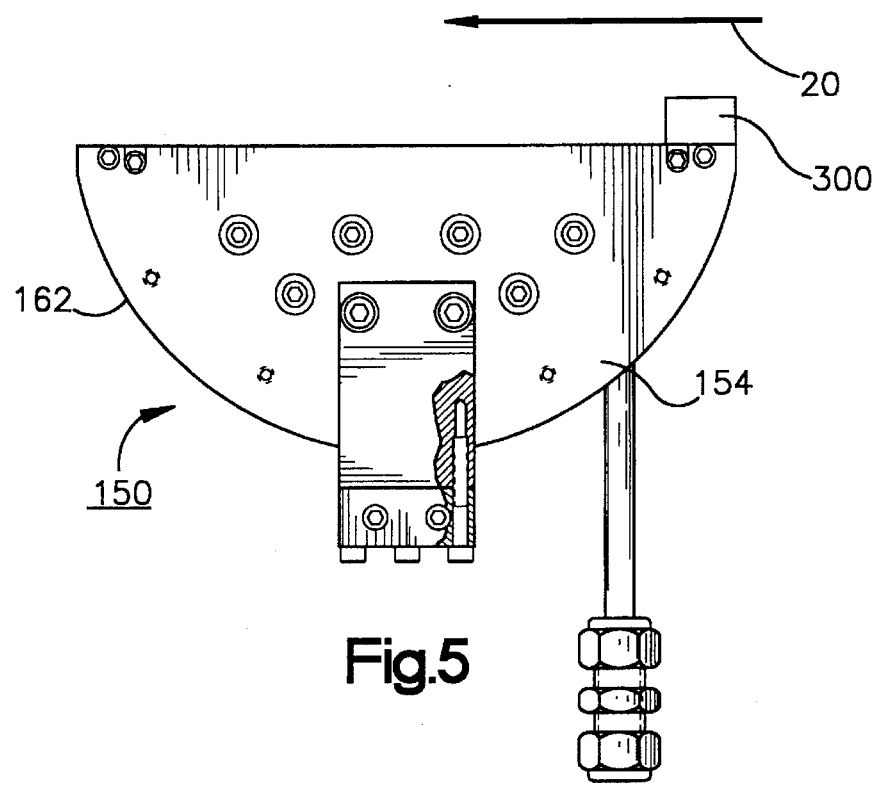
FIG. 5 is an end view of an ion beam neutralizer as seen from the plane 5—5 in FIG. 3.

Movement of the beam 20 past the beam neutralizer is in the direction shown in FIGS. 5 and 6. To impede contamination of the neutralizer from contact with ions from the beam 20, a guard 300 is attached to the frame 152 and extends across the width of the neutralizer. During ion implantation the neutralizer 150 can become overheated. Water is circulated into the neutralizer 150 by an inlet fitting 301 and routed through a conduit 302 to the endwall 154 having an internal passageway 154a along a conduit 303 on the inside of the wall (See FIG. 6) and out a conduit 304 and fitting 305.

Figure 14:
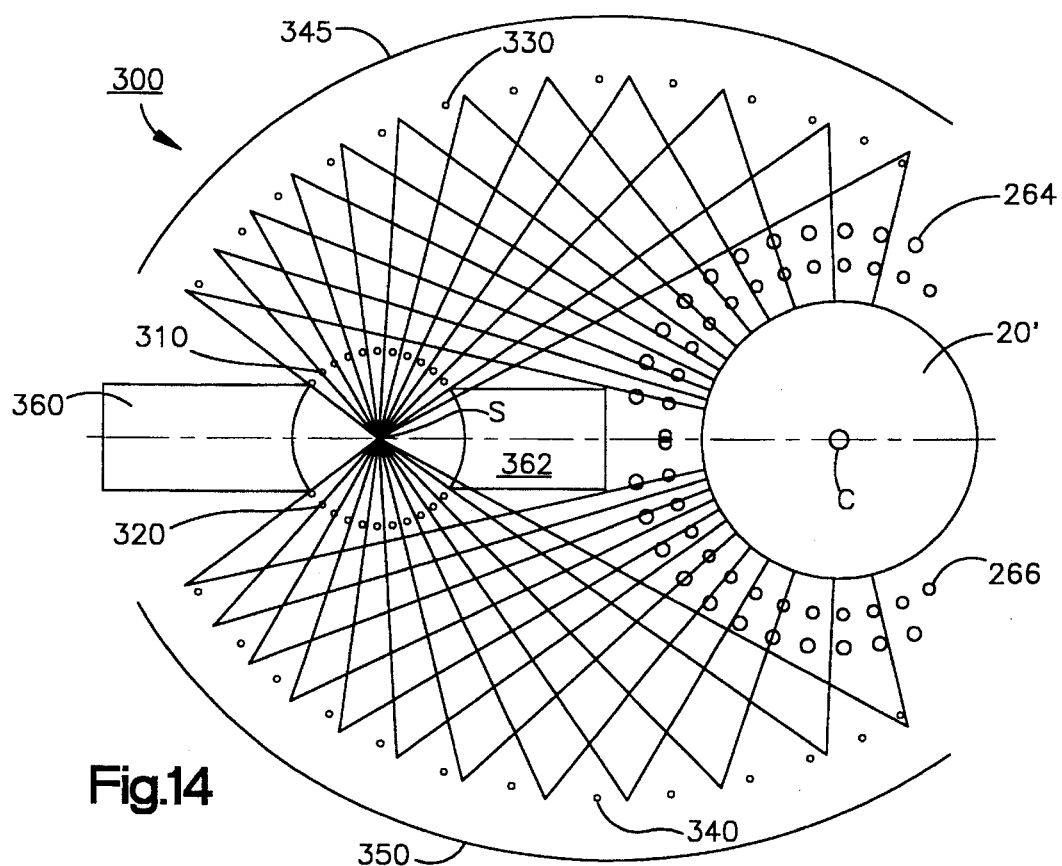
FIG. 14 is a schematic representation of an alternate embodiment of the invention.

An alternate ion beam neutralizer 300 is disclosed in schematic form in FIG. 14. An ion beam 20' having a generally circular cross section for treating a workpiece is seen traveling in a direction perpendicular to the plane of FIG. 14. A line of electron-emitting filaments coincides with a source location S spaced from the beam 20'. The source emits electrons which are accelerated away from the source S by two energized grids 310, 320 (typically constructed from multiple wire segments strung back and forth the length of the neutralizer 300) biased at a potential of approximately 100 volts to increase the energy of the electrons of the source to the 100 electronvolt range. After passing through the grids 310, 320, the electrons experience linear motion through a region bounded by a second pair of grids 330, 340. These grids 330, 340 are also biased at the 100-volt level so that electrons traveling between the grids move in straight lines at uniform energy. After passing through the grids 330, 340, the electrons experience a large electric field produced by negatively biased reflector plates 345, 350. These reflector plates cause the electrons to experience a deflection toward the beam 20'.

The source S and a centerpoint C of the beam 20' are located at the focus points of an ellipse that coincides with the position of the two reflector plates 345, 350. Electrons coming off the filaments at the source S are intercepted along certain travel paths by two metal shields 360, 362. The shield 362 prevents electrons from leaving the source S and traveling directly into the region of the beam 20'. The ion beam neutralizer 300 includes two additional grids 264, 266 which are electrically biased by a power supply such as the supply 200 shown in FIG. 1. The grid 264 is maintained at 100 volts and the grid 266 is grounded. The source S includes multiple filaments arranged in a linear fashion along a length of the beam 20'. By controlling the potential applied to a given filament, the electron density emitted by the neutralizer 300 and traveling to the beam 20' can be controlled to achieve beam neutralization prior to the beam striking a workpiece.

A preferred embodiment of the present invention has been described with a degree of particularity. It is the intention that the invention include all modifications and modifications falling within the spirit or scope of the disclosed design falling within the spirit or scope of the appended claims.

I claim:
1. An ion implanter for ion beam treatment of workpieces comprising:
   a) an ion beam source that emits positively-charged ions used in treating the workpieces;
   b) ion beam forming means comprising structure for forming an ion beam from ions exiting the ion beam source;
   c) an implantation station comprising structure for positioning workpieces in the ion beam;
   d) a controller for monitoring ion beam current and controlling dosage of ions impacting the workpieces; and
   e) a beam neutralizer positioned relative to the ion beam to inject electrons into the ion beam before the ion beam reaches the implantation station including:
      i) an electrically conductive reflector having a convex surface facing the ion beam for reflecting electrons into the ion beam;

ii) an electron source for emitting neutralizing electrons into a region between the convex surface of the reflector and the electron source;

iii) a first conductive grid spaced from the electron source for accelerating electrons entering the region between the convex surface of the reflector and the electron source toward the convex surface of the reflector;

iv) a second conductive grid spaced from the convex surface of the reflector in the region between the convex surface of the reflector and the electron source defining a region of electron envelope expansion between said first and second conductive grids and a region of electron reflection between the second conductive grid and the reflector;

v) conductive means for decelerating the electrons after they are reflected away from the reflector but before they enter the ion beam; and vi) a power supply for electrically biasing the first and second grids and the reflector with respect to the electron source to cause the electrons to pass through the region of electron envelope expansion and reflect away from the reflector into the ion beam.

2. The ion implanter of claim 1 wherein the electron source comprises a number of elongated filaments that are aligned end to end to define an axial extent of the beam neutralizer.

3. The ion beam implantation system of claim 1 wherein the first and second conductive grids are biased at the same electrical potential by the power supply to define a zone of generally undeflected electron movement before the electrons are deflected toward the ion beam as they approach the reflector.

4. An ion beam neutralizer for use with an ion implanter comprising:

a) a metallic body having a curved deflection surface supported in a position to reflect electrons into an ion beam as ions within the ion beam move past the metallic body;

b) one or more elongated electron emitting filaments mechanically fixed with respect to the metallic body and electrically isolated from said metallic body;

c) electron directing means for directing electrons generated by the one or more elongated electron emitting filaments toward the curved deflection surface of the metallic body comprising i) a first grid spaced from the electron emitting filaments to accelerate electrons away from the filaments and ii) a second grid spaced from the metallic body that defines an electron envelope expansion region between said first and second grids;

d) support structure for positioning the metallic body and the first and second grids with respect to the one or more filaments; and e) power supply means for biasing the electron emitting filaments at a negative potential relative to the metallic body. controllably biasing the first and second grids to accelerate the electrons to the expansion region between the two grids, and for applying a potential across the filaments to set up a current for heating the filaments sufficiently to emit electrons;

f) said metallic body including a generally parabolic surface facing the ion beam to create an electric field between the metallic body and the second grid to re-direct electrons into the ion beam.

5. The neutralizer of claim 4 wherein the support structure defines passageways for routing a coolant through the support structure to dissipate heat.

6. An ion beam neutralizer for use with an ion implanter comprising:

a) a plurality of axially elongated filaments supported under tension in end to end relation to each other;

b) an arcuate, axially elongated electron reflector supported along the length of the plurality of axially elongated filaments and partially surrounding the filaments, for directing electrons emitted from the filaments along reflected paths into an ion beam after the electrons leave the filaments;

c) a first electrically-conductive grid defining a curved grid portion radially inward of the reflector, wherein the curved grid portion includes gaps for allowing electrons emitted from the filaments passing through an electron envelope expansion region to enter a region between the grid and the reflector where they are reflected by an electric field that is set up between the first grid and the reflector;

d) a second electrically-conductive grid for decelerating electrons after they are reflected away from the reflector but before they enter the ion beam; and d) a support member for supporting the filaments, the first and second grids and the reflector in spaced relation and positioning said filaments, first and second grids and reflector relative to an ion beam of moving positively charged ions; and e) a power supply for setting up an electron emitting current in the axially elongated filaments and biasing the electron reflector and electrically conductive first and second grids.

7. A beam neutralizer according to claim 6 additionally comprising a third electrically conductive grid biased by the power supply to accelerate electrons away from the elongated filaments to a region between the first and second electrically conductive grids.

8. A beam neutralizer according to claim 6 wherein the filaments extend substantially the length of the ion beam neutralizer.

9. A beam neutralizer according to claim 6 including primary electron directing means associated with each filament for directing primary electrons emitted from such filament toward a portion of an inwardly facing surface of the electron reflector.

10. The ion beam neutralizer of claim 6 where the elongated electron reflector comprises a segment of a parabola as seen from one end of the reflector.

11. A method for introducing negatively charged electrons into an ion beam of positively charged ions before the ion beam reaches a workpiece that is treated with the ion beam comprising the steps of:

a) aligning a series of elongated filaments end to end along an axial length of the ion beam and energizing said elongated filaments to cause neutralizing electrons to be emitted;

b) inhibiting direct movement of the electrons into the ion-beam while accelerating electrons along diverse directions away from the filaments;

c) setting up a region of controlled electric potential through which the electrons pass at constant energy after they are accelerated away from the filaments; and d) deflecting the electrons into the ion beam by positioning a curved electron deflector in their path at a point they leave the region of relatively constant electric potential and biasing the curved deflector to set up an electric field which reflects the electrons along generally parallel paths toward the ion beam.

12. The method of claim 11 wherein the step of setting up a region of controlled electric potential is performed by positioning spaced apart grids through which the electrons move and biasing the spaced apart grids at the same electric potential.

* * * * *